United States Patent
Kaneko et al.

(10) Patent No.: US 12,298,646 B2
(45) Date of Patent: May 13, 2025

(54) DISPLAY DEVICE (71) Applicant: Japan Display Inc., Tokyo (JP)

(72) Inventors: Toshiki Kaneko, Tokyo (JP); Akihiro Hanada, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 775 days.

(21) Appl. No.: 17/509,090

(22) Filed: Oct. 25, 2021

(65) Prior Publication Data
US 2022/0128882 A1 Apr. 28, 2022

(30) Foreign Application Priority Data

Oct. 26, 2020 (JP) ................. 2020-179098

(51) Int. Cl.
| | |
|---|---|
| *G02F 1/16766* | (2019.01) |
| *G02F 1/167* | (2019.01) |
| *G02F 1/16756* | (2019.01) |
| *H01L 27/12* | (2006.01) |
| *H10D 86/40* | (2025.01) |
| *H10D 86/60* | (2025.01) |

(52) U.S. Cl.
CPC ...... *G02F 1/16766* (2019.01); *G02F 1/16756* (2019.01); *H10D 86/423* (2025.01); *H10D 86/60* (2025.01); *G02F 1/167* (2013.01)

(58) Field of Classification Search
None
See application file for complete search history.

(56) References Cited

U.S. PATENT DOCUMENTS

| | | | |
|---|---|---|---|
| 2008/0017937 A1* | 1/2008 | Morimoto | ........... H01L 27/1214 257/411 |
| 2013/0286300 A1* | 10/2013 | Lee | ..................... G02F 1/13338 438/34 |
| 2014/0035478 A1* | 2/2014 | Kitakado | .......... H01L 29/66969 315/210 |
| 2017/0278872 A1 | 9/2017 | Ohara | |
| 2020/0259020 A1 | 8/2020 | Watakabe et al. | |

FOREIGN PATENT DOCUMENTS

| | | | | |
|---|---|---|---|---|
| JP | | 3338481 B2 * | 10/2002 | ......... H01L 27/1214 |
| JP | | 2017-183312 A | 10/2017 | |
| JP | | 2020-129635 A | 8/2020 | |

OTHER PUBLICATIONS

Machine translation of JP3338481B2.*

* cited by examiner

*Primary Examiner* — Yara B Green
*Assistant Examiner* — Fakeha Sehar
(74) *Attorney, Agent, or Firm* — XSENSUS LLP (57) ABSTRACT

According to one embodiment, a display device includes a first oxide semiconductor, a second oxide semiconductor, a first source electrode contacting the first oxide semiconductor in a first opening, a first drain electrode contacting the first oxide semiconductor in a second opening, a second source electrode contacting the second oxide semiconductor in a third opening, and a second drain electrode contacting the second oxide semiconductor in a fourth opening. A length of a layer stack of the second insulating film and the first source electrode between the first opening and the second opening is greater than a length of a layer stack of the second insulating film and the second source electrode between the third opening and the fourth opening.

12 Claims, 4 Drawing Sheets

DISPLAY DEVICE

CROSS-REFERENCE TO RELATED APPLICATIONS

This application is based upon and claims the benefit of priority from Japanese Patent Application No. 2020-179098, filed Oct. 26, 2020, the entire contents of which are incorporated herein by reference.

FIELD

Embodiments described herein relate generally to a display device.

BACKGROUND

In a liquid crystal display device, a technique of providing a transistor comprising an oxide semiconductor in a pixel circuit of a display area and providing a transistor comprising a silicon semiconductor in a drive circuit of a surrounding area has been proposed.

DETAILED DESCRIPTION

In general, according to one embodiment, there is provided a display device comprising an insulating substrate, a first gate electrode disposed in a surrounding area above the insulating substrate and included in a gate driver, a second gate electrode disposed in a display area above the insulating substrate and integrated with a gate line driven by the gate driver, a first insulating film covering the first gate electrode and the second gate electrode, a first oxide semiconductor disposed above the first gate electrode and being in contact with the first insulating film, a second oxide semiconductor disposed above the second gate electrode and being in contact with the first insulating film, a second insulating film covering the first oxide semiconductor and the second oxide semiconductor, a first source electrode being in contact with the second insulating film and being in contact with the first oxide semiconductor in a first opening of the second insulating film, a first drain electrode being in contact with the second insulating film and being in contact with the first oxide semiconductor in a second opening of the second insulating film, a second source electrode being in contact with the second insulating film and being in contact with the second oxide semiconductor in a third opening of the second insulating film, and a second drain electrode being in contact with the second insulating film and being in contact with the second oxide semiconductor in a fourth opening of the second insulating film. A length of a layer stack of the second insulating film and the first source electrode between the first opening and the second opening is greater than a length of a layer stack of the second insulating film and the second source electrode between the third opening and the fourth opening.

According to another embodiment, there is provided a display device comprising an insulating substrate, a first gate electrode disposed in a surrounding area above the insulating substrate and included in a gate driver, a second gate electrode disposed in a display area above the insulating substrate and integrated with a gate line driven by the gate driver, a first insulating film covering the first gate electrode and the second gate electrode, a first oxide semiconductor disposed above the first gate electrode and being in contact with the first insulating film, and a second oxide semiconductor disposed above the second gate electrode and being in contact with the first insulating film. The first oxide semiconductor has a first channel area, and a first low-resistance area being adjacent to the first channel area and having a lower resistance than the first channel area. The second oxide semiconductor has a second channel area, and a second low-resistance area being adjacent to the second channel area and having a lower resistance than the second channel area. A length of the first low-resistance area is greater than a length of the second low-resistance area.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed descriptions of them which are considered redundant may be omitted where appropriate.

In the drawings, an X-axis, a Y-axis and a Z-axis which are orthogonal to one another are shown as needed for easier understanding. A direction along the X-axis is referred to as a first direction X, a direction along the Y-axis is referred to as a second direction Y, and a direction along the Z-axis is referred to as a third direction Z. A plane defined by the X-axis and the Y-axis is referred to as an X-Y plane, and viewing the X-Y plane is referred to as planar view.

In the present embodiment, an electrophoretic display device is described as an example of the display device. The main configuration disclosed in the present embodiment can also be applied to a liquid crystal display device, a display device comprising a self-luminous light-emitting element such as an organic electroluminescent (EL) element, a micro-LED or a mini-LED, or the like.

Figure 1:
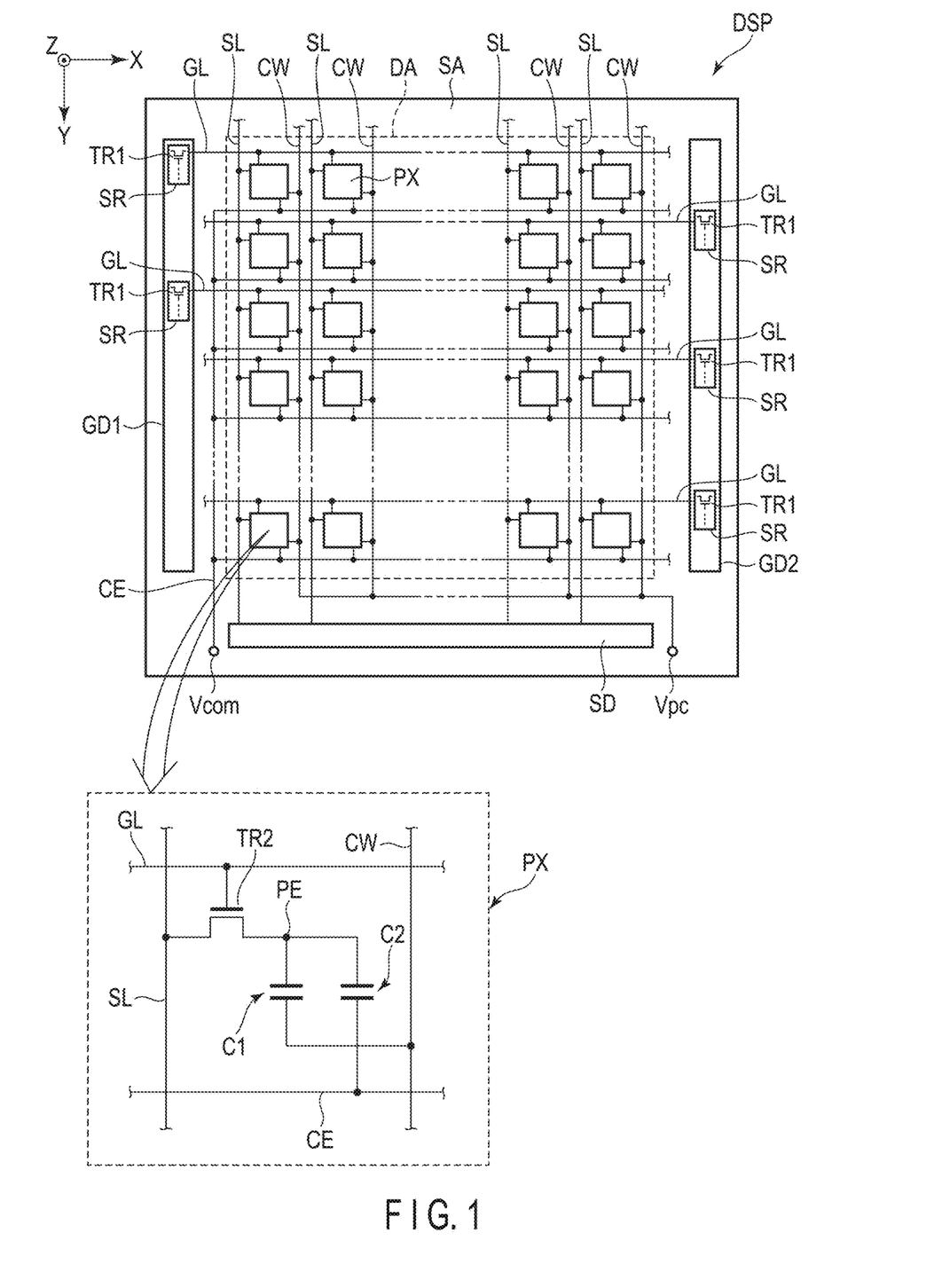
FIG. 1 is a plan view showing the configuration of a display device DSP according to the present embodiment.

FIG. 1 is a plan view showing the configuration of a display device DSP according to the present embodiment. The display device DSP comprises a display area DA where an image is displayed, and a surrounding area (non-display area) SA around the display area DA. In the example shown in FIG. 1, the surrounding area SA is formed like a frame surrounding the display area DA.

The display device DSP comprises gate drivers GD1 and GD2 and a source driver SD in the surrounding area SA. The gate drivers GD1 and GD2 each comprise a plurality of shift registers SR. Each shift register SR comprises a first transistor TR1. The gate drivers GD1 and GD2 are formed this way on the same substrate together with the respective elements of the display area DA.

The display device DSP comprises a plurality of pixels PX, a plurality of gate lines GL, a plurality of source lines SL, a plurality of capacitance lines CW, and a common electrode CE in the display area DA. The pixels PX are arranged in a matrix in the first direction X and the second direction Y.

The gate lines GL each extend along the first direction X, and are arranged at intervals in the second direction Y. The gate lines GL may be referred to also as scanning lines. The gate lines GL are electrically connected to the gate drivers GD1 and GD2. For example, odd-numbered gate lines GL are connected to the shift registers SR of the gate driver GD1, and even-numbered gate lines GL are connected to the shift registers SR of the gate driver GD2. The gate lines GL are respectively driven by the gate drivers GD1 and GD2.

The source lines SL each extend along the second direction Y, and are arranged at intervals in the first direction X. The source lines SL may be referred to also as signal lines. The source lines SL intersect the gate lines GL in the display area DA. The source lines SL are electrically connected to the source driver SD. The source lines SL are respectively driven by the source driver SD.

The capacitance lines CW extend along the first direction X or the second direction Y. The capacitance lines CW are, for example, bundled together in the surrounding region SA, and are connected to a voltage supply portion Vpc to which a predetermined voltage is supplied.

The common electrode CE is disposed over the pixels PX. The common electrode CE is connected to a voltage supply portion Vcom to which a predetermined voltage is supplied.

As shown enlarged in FIG. 1, each pixel PX comprises a second transistor TR2 and a pixel electrode PE. As will be described later, the first transistor TR1 and the second transistor TR2 are composed of, for example, a thin-film transistor (TFT). The second transistor TR2 is electrically connected to the gate line GL and the source line SL. The gate line GL is electrically connected to the second transistors TR2 in the respective pixels PX arranged in the first direction X. The source line SL is electrically connected to the second transistors TR2 in the respective pixels PX arranged in the second direction Y.

The pixel electrode PE is electrically connected to the second transistor TR2. Each pixel electrode PE is opposed to the common electrode CE. A capacitance CS1 is formed between the pixel electrode PE and the capacitance line CW. A capacitance CS2 is formed between the common electrode CE and the pixel electrode PE.

Figure 2:
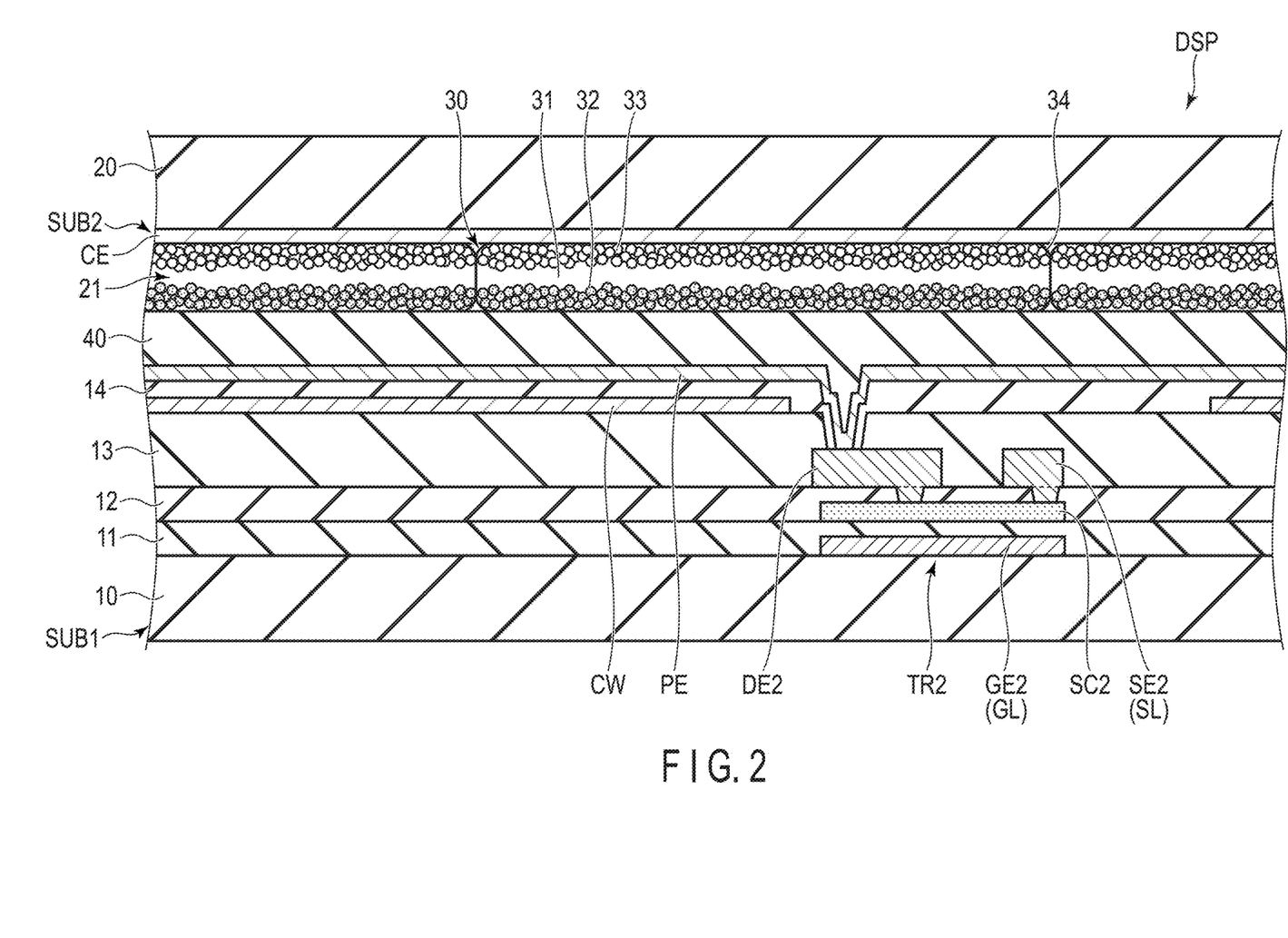
FIG. 2 is a cross-sectional view of the display device DSP including a pixel PX shown in FIG. 1.

FIG. 2 is a cross-sectional view of the display device DSP including the pixel PX shown in FIG. 1.

The first substrate SUB1 comprises an insulating substrate 10, insulating films 11 to 14, the second transistor TR2, the capacitance line CW and the pixel electrode PE. The structure of the second transistor TR2 is shown simplified. In addition, the insulating films 11 to 14 are also shown simplified.

The insulating substrate 10 is formed of an insulating material such as resin or glass. The details of the second transistor TR2 will be described later, but the second transistor TR2 comprises a second gate electrode GE2 integrated with the gate line GL, a second source electrode SE integrated with the source line SL, a second drain electrode DE2, and a second oxide semiconductor SC2. In the present embodiment, an electrode on a side electrically connected to the source line SL is referred to as the second source electrode SE2, and an electrode on a side electrically connected to the pixel electrode PE is referred to as the second drain electrode DE2.

The insulating film 11 is interposed between the second gate electrode GE2 and the second oxide semiconductor SC2. The insulating film 12 is interposed between the second oxide semiconductor SC2 and the second source electrode SE2 and between the second oxide semiconductor SC2 and the second drain electrode DE2. The insulating film 13 covers the second source electrode SE2 and the second drain electrode DE2. The insulating film 11 and the insulating film 12 each are an inorganic insulating film, and may be a single layer or a layer stack of a plurality of types of inorganic insulating film. The insulating film 13 is, for example, a layer stack of one or more types of inorganic insulating film and an organic insulating film. One inorganic insulating film included in the insulating film 13 directly covers the second source electrode SE2 and the second drain electrode DE2.

The capacitance line CW is disposed on the insulating film 13, and is covered with the insulating film 14. The pixel electrode PE is disposed on the insulating film 14. The pixel electrode PE is in contact with the second drain electrode DE2, and is electrically connected to the second transistor TR2.

The second substrate SUB2 comprises an insulating substrate 20, the common electrode CE and an electrophoretic element 21. The insulating substrate 20 is formed of an insulating material such as resin or glass. The common electrode CE is located between the insulating substrate 20 and the electrophoretic element 21. The electrophoretic element 21 is located between the pixel electrode PE and the common electrode CE. The electrophoretic element 21 is formed of a plurality of microcapsules 30 arranged almost without any space between them.

The first substrate SUB1 and the second substrate SUB2 are bonded together by an adhesive layer 40. In the illustrated example, the adhesive layer 40 is located between the pixel electrode PE and the electrophoretic element 21.

The microcapsules 30 have a diameter of, for example, about 20 μm to 70 μm. More than one microcapsule 30 is disposed between one pixel electrode PE and the common electrode CE. Each microcapsule 30 comprises a dispersion medium 31, a plurality of black particles 32 and a plurality of white particles 33. The black particles 32 and the white particles 33 may be referred to also as electrophoretic particles.

An outer shell 34 of the microcapsule 30 is formed of, for example, transparent resin such as acrylic resin. The dispersion medium 31 is a liquid for dispersing the black particles 32 and the white particles 33 in the microcapsule 30. The black particles 32 and the white particles 33 have opposite electrical charges. For example, the black particles 32 are positively charged, and the white particles 33 are negatively charged.

In the electrophoretic element 21 having the above configuration, when the pixel PX displays black, the pixel electrode PE is held at high potential relative to the common electrode CE. That is, when the potential of the common electrode CE is used as a reference potential, the pixel electrode PE is held at positive polarity. Accordingly, while the positively charged black particles 32 are attracted to the common electrode CE, the negatively charged white particles 33 are attracted to the pixel electrode PE. As a result, black is viewed when the pixel PX is observed from above the second substrate SUB2.

On the other hand, when the pixel PX displays white, the pixel electrode PE is held at low potential relative to the common electrode CE. That is, when the potential of the common electrode CE is used as a reference potential, the pixel electrode PE is held at negative polarity. Accordingly, while the negatively charged white particles 33 are attracted to the common electrode CE, the positively charged black particles 32 are attracted to the pixel electrode PE. As a result, white is viewed when the pixel PX is observed.

The electrophoretic display device described here is not limited to a monochrome mode but can also be applied to a color mode in which color particles including red particles, green particles and blue particles are operated by electrophoresis. The color mode in particular has the advantage that it can improve the naturally low electrophoresis speed by applying high voltage and can rewrite the color screen at high speed.

Figure 3:
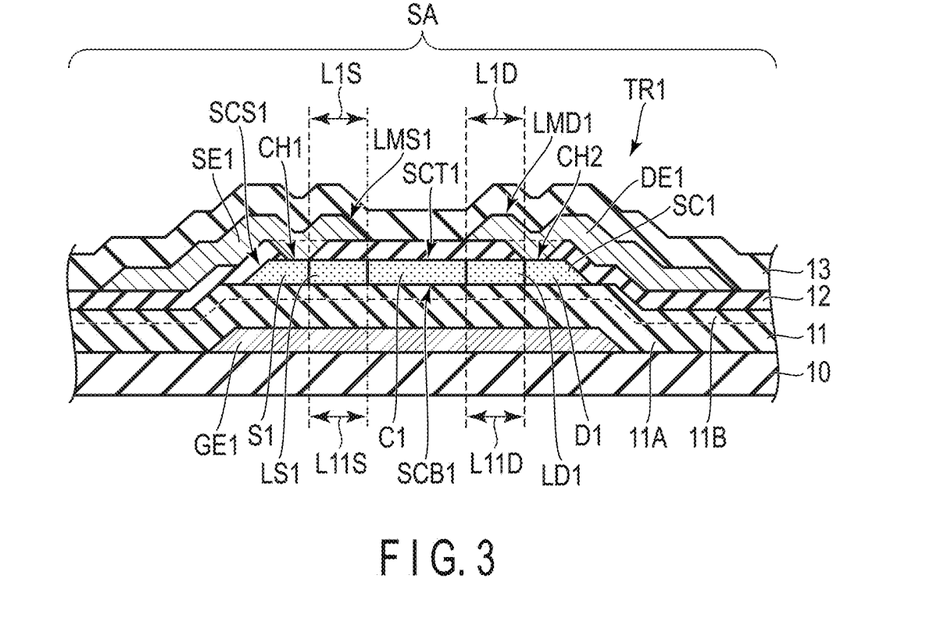
FIG. 3 is a cross-sectional view showing an example of a first transistor TR1.

FIG. 3 is a cross-sectional view showing an example of the first transistor TR1.

The first transistor TR1 is disposed in the surrounding area SA, and is included in each of the gate drivers GD1 and GD2 shown in FIG. 1. The first transistor TR1 comprises a first gate electrode GE1, a first oxide semiconductor SC1, a first source electrode SE1, and a first drain electrode DE1. In the present embodiment, an electrode on a side electrically connected to a power line (an input side) in the shift register SR is referred to as the first source electrode SE1, and an electrode on a side electrically connected to the gate line GL of the display area DA (an output side) in the shift register SR is referred to as the first drain electrode DE1.

The first gate electrode GE1 is disposed above the insulating substrate 10. In the example shown in FIG. 3, the first gate electrode GE1 is in contact with the insulating substrate 10. However, another insulating film may be interposed between the insulating substrate 10 and the first gate electrode GE1.

The insulating film 11 is an inorganic insulating film, and covers the first gate electrode GE1. In the example shown in FIG. 3, the insulating film 11 is a layer stack of a thin film 11A and a thin film 11B. The thin film 11A is formed of silicon nitride (SiN), and directly covers the insulating substrate 10 and the first gate electrode GE1. The thin film 11B is formed of silicon oxide (SiO), and is directly stacked on the thin film 11A. For example, the thickness of the thin film 11B is less than the thickness of the thin film 11A. For example, the thickness of the thin film 11A is 50 nm to 400 nm, and the thickness of the thin film 11B is 20 nm to 300 nm. The thickness of the insulating film 11 is greater than or equal to 300 nm. It should be noted that the insulating film 11 may be a single layer of thin film formed of silicon oxide.

The first oxide semiconductor SC1 is disposed above the first gate electrode GE1, and is in contact with the insulating film 11. That is, a lower surface SCB1 of the first oxide semiconductor SC1 is in contact with the insulating film 11 which is silicon oxide.

The insulating film 12 directly covers the first oxide semiconductor SC1 and the insulating film 11. The insulating film 12 is an inorganic insulating film formed of silicon oxide (SiO). That is, an upper surface SCT1 and a side surface SCS1 of the first oxide semiconductor SC1 are in contact with the insulating film 12 which is silicon oxide.

The first source electrode SE1 and the first drain electrode DE1 are disposed on the insulating film 12, and are in contact with the insulating film 12. In addition, the first source electrode SE1 is apart from the first drain electrode DE1.

The first source electrode SE1 is in contact with the first oxide semiconductor SC1 in a first opening CH1 of the insulating film 12. The first drain electrode DE1 is in contact with the first oxide semiconductor SC1 in a second opening CH2 of the insulating film 12.

The insulating film 13 directly covers the first source electrode SE1 and the first drain electrode DE1. The insulating film 13 is an inorganic insulating film formed of silicon oxide (SiO), for example. In addition, the insulating film 13 is in contact with the insulating film 12 between the first source electrode SE1 and the first drain electrode DE1.

The first gate electrode GE1, the first source electrode SE1 and the first drain electrode DE1 are formed of, for example, a metal material such as aluminum (Al), titanium (Ti), molybdenum (Mo), tungsten (W), silver (Ag), copper (Cu) or chromium (Cr), an alloy of these metal materials combined, or the like.

The first oxide semiconductor SC1 has a first channel area C1, first low-resistance areas LS1 and LD1, a first source area S1 and a first drain area D1. The first low-resistance areas LS1 and LD1 are adjacent to the first channel area C1. The first low-resistance area LS1 is located between the first channel area C1 and the first source area S1. The first low-resistance area LD1 is located between the first channel area C1 and the first drain area D1.

The first channel area C1 is an area having the highest resistance in the first oxide semiconductor SC1, and overlaps a space between the first source electrode SE1 and the first drain electrode DE1 (or a part where the insulating film 13 is directly stacked on the insulating film 12).

The first low-resistance areas LS1 and LD1 are areas having a lower resistance than the first channel area C1. The first low-resistance area LS1 overlaps a layer stack LMS1 of the insulating film 12 and the first source electrode SE1 between the first opening CH1 and the second opening CH2. The first low-resistance area LD1 overlaps a layer stack LMD1 of the insulating film 12 and the first drain electrode DE1 between the first opening CH1 and the second opening CH2.

The first source area S1 is an area having a lower resistance than the first low-resistance area LS1, and is in contact with the first source electrode SE1 in the first opening CH1. The first drain area D1 is an area having a lower resistance than the first low-resistance area LD1, and is in contact with the first drain electrode DE1 in the second opening CH2.

At least the first channel area C1 and the first low-resistance areas LS1 and LD1 of the first oxide semiconductor SC1 are located directly above the first gate electrode GE1. In addition, the layer stacks LMS1 and LMD1 are also located directly above the first gate electrode GE1. In the example shown in FIG. 3, almost the entire first oxide semiconductor SC1 including the first source area S1 and the first drain area D1 is located directly above the first gate electrode GE1.

A length L1S of the layer stack LMS1 is equal to a length L11S of the first low-resistance area LS1. A length L1D of the layer stack LMD1 is equal to a length L11D of the first low-resistance area LD1. In addition, in one example, the length L1S is equal to the length L1D, and the length L11S is equal to the length L11D.

However, depending on the thickness of the first oxide semiconductor SC1, the length L1S and the length L11S do not necessarily match each other, and the length L1D and the length L11D do not necessarily match each other. For example, when the thickness of the first oxide semiconductor SC1 is less than or equal to 50 nm, the length L1S may be greater than the length L11S, and similarly the length L1D may be greater than the length L11D.

Figure 4:
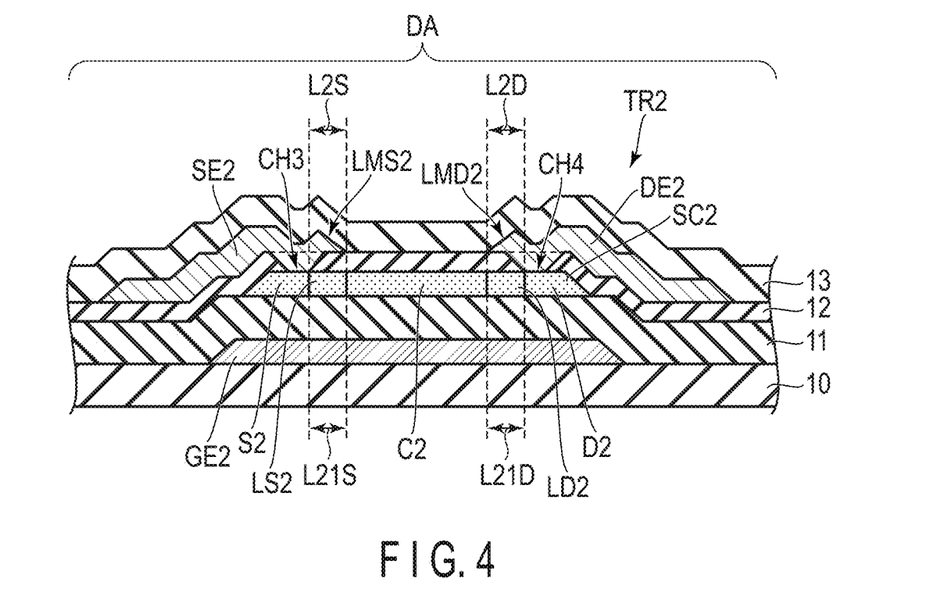
FIG. 4 is a cross-sectional view showing an example of a second transistor TR2.

FIG. 4 is a cross-sectional view showing an example of the second transistor TR2. The insulating films 11 to 13 extend not only in the surrounding area SA shown in FIG. 3 but also in the display area DA shown in FIG. 4.

The second transistor TR2 is disposed in the display area DA, and is included in the pixel PX shown in FIG. 1. The second transistor TR2 comprises a second gate electrode GE2, a second oxide semiconductor SC2, a second source electrode SE2 and a second drain electrode DE2.

The second gate electrode GE2 is disposed above the insulating substrate 10, and is located in the same plane as the first gate electrode GE1. In the example shown in FIG. 4, the second gate electrode GE2 is in contact with the insulating substrate 10. However, another insulating film may be interposed between the insulating substrate 10 and the second gate electrode GE2. The second gate electrode GE2 is covered with the insulating film 11.

The second oxide semiconductor SC2 is disposed above the second gate electrode GE2, and is located in the same plane as the first oxide semiconductor SC1. The second oxide semiconductor SC2 is covered with the insulating film 12. That is, the second oxide semiconductor SC2 is in contact with the first insulating film 11 and the insulating film 12 which are silicon oxide.

The second source electrode SE2 and the second drain electrode DE2 are disposed on the insulating film 12, and are in contact with the insulating film 12. That is, the second source electrode SE2 and the second drain electrode DE2 are located in the same plane as the first source electrode SE1 and the first drain electrode DE1. The second source electrode SE2 is apart from the second drain electrode DE2.

The second source electrode SE2 is in contact with the second oxide semiconductor SC2 in a third opening CH3 of the insulating film 12. The second drain electrode DE2 is in contact with the second oxide semiconductor SC2 in a fourth opening CH4 of the insulating film 12. The second source electrode SE2 and the second drain electrode DE2 are covered with the insulating film 13. In addition, the insulating film 13 is in contact with the insulating film 12 between the second source electrode SE2 and the second drain electrode DE2.

The second gate electrode GE2 is formed of the same material as the first gate electrode GE1.

The first source electrode SE1, the first drain electrode DE1, the second source electrode SE2 and the second drain electrode DE2 are formed of the same material. The second oxide semiconductor SC2 is formed of the same material as the first oxide semiconductor SC1.

The second oxide semiconductor SC2 has a second channel area C2, second low-resistance areas LS2 and LD2, a second source area S2 and a second drain area D2. The second low-resistance areas LS2 and LD2 are adjacent to the second channel area C2. The second low-resistance area LS2 is located between the second channel area C2 and the second source area S2. The second low-resistance area LD2 is located between the second channel area C2 and the second drain area D2.

The second channel area C2 is an area having the highest resistance in the second oxide semiconductor SC2, and overlaps a space between the second source electrode SE2 and the second drain electrode DE2.

The second low-resistance areas LS2 and LD2 are areas having a lower resistance than the second channel area C2. The second low-resistance area LS2 overlaps a layer stack LMS2 of the insulating film 12 and the second source electrode SE2 between the third opening CH3 and the fourth opening CH4. The second low-resistance area LD2 overlaps a layer stack LMD2 of the insulating film 12 and the second drain electrode DE2 between the third opening CH3 and the fourth opening CH4.

The second source area S2 is an area having a lower resistance than the second low-resistance area LS2, and is in contact with the second source electrode SE2 in the third opening CH3. The second drain area D2 is an area having a lower resistance than the second low-resistance area LD2, and is in contact with the second drain electrode DE2 in the fourth opening CH4.

At least the second channel area C2 and the second low-resistance areas LS2 and LD2 of the second oxide semiconductor SC2 are located directly above the second gate electrode GE2. In addition, the layer stacks LMS2 and LMD2 are also located directly above the second gate electrode GE2. In the example shown in FIG. 4, almost the entire second oxide semiconductor SC2 including the second source area S2 and the second drain area D2 is located directly above the second gate electrode GE2.

A length L2S of the layer stack LM2 is equal to a length L21S of the second low-resistance area LS2. A length L2D of the layer stack LMD2 is equal to a length L21D of the second low-resistance area LD2. In addition, in one example, the length L2S is equal to the length L2D, and the length L21S is equal to the length L21D. However, depending on the thickness of the second oxide semiconductor SC2, the length L2S and the length L21S do not necessarily match each other, and the length L2D and the length L21D do not necessarily match each other.

Here, the first transistor TR1 shown in FIG. 3 and the second transistor TR2 shown in FIG. 4 are compared with each other.

The length L1S of the layer stack LMS1 is greater than the length L2S of the layer stack LMS2 (L1S>L2S). In other words, the length L11S of the first low-resistance area LS1 is greater than the length L21S of the second low-resistance area LS2 (L11S>L21S).

In addition, the length L1D of the layer stack LMD1 is greater than the length L2D of the layer stack LMD2 (L1D>L2D). In other words, the length L11D of the first low-resistance area LD1 is greater than the length L21D of the second low-resistance area LD2 (L11D>L21D).

In one example, the length L1S, the length L11S, the length L1D and the length L11D are greater than or equal to 2 µm.

In the specification, for example, the insulating film 11 corresponds to the first insulating film (or the first inorganic insulating film), the insulating film 12 corresponds to the second insulating film (or the second inorganic insulating film), and the insulating film 13 corresponds to the third insulating film (or the third insulating film).

The first transistor TR1 and the second transistor TR2 described above can be manufactured by, for example, the following manufacturing method. Only the main steps of the manufacturing method of the first transistor TR1 are described here. Since the second transistor TR2 is manufactured through the same steps as the first transistor TR1, the description is omitted here.

The first oxide semiconductor SC1 is formed on the insulating film 11, and then the insulating film 12 is formed. After that, the first opening CH1 and the second opening CH2 are formed, and then the first source electrode SE1 and the first drain electrode DE1 are formed. After that, the insulating film 13 is formed. The insulating films 12 and 13 are both silicon oxide.

Between the first source electrode SE1 and the first drain electrode DE1, oxygen is supplied from the insulating film 13 to the first oxide semiconductor SC1 via the insulating film 12. Accordingly, an area of the first oxide semiconductor SC1 which overlaps the space between the first source electrode SE1 and the first drain electrode DE1 is sufficiently oxidized, and consequently the first channel area C1 is formed.

In areas adjacent to the first channel area C1, the first source electrode SE1 and the first drain electrode DE1 serve as masks, and the amounts of oxygen supplied from the insulating film 13 to them are reduced. Therefore, oxidation of areas of the first oxide semiconductor SC1 which overlap the first source electrode SE1 and the first drain electrode DE1 is suppressed, and consequently the first low-resistance areas LS1 and LD1 having a lower resistance than the first channel area C1 are formed.

As another manufacturing method, the first oxide semiconductor SC1 is formed on the insulating film 11, and then the insulating film 12 is formed. After that, a resist having openings in areas where the first low-resistance areas LS1 and LD1 are to be formed is formed on the insulating film 12. After that, while the resist is used as a mask, boron (B) or phosphorus (P) is injected into the first oxide semiconductor SC1. Accordingly, the first low-resistance areas LS1 and LD1 are formed.

A transistor configured to comprise an oxide semiconductor as a semiconductor (referred to as an oxide semiconductor transistor) has the characteristics that off-state leakage current is extremely small. Therefore, the oxide semiconductor transistor can hold an electrical charge written to the pixel capacitance for a long time and can continue holding a predetermined voltage, and is suitable as the switching element (second transistor TR2) of the pixel PX.

On the other hand, the first transistor TR1 included in each of the shift registers SR of the gate drivers GD1 and GD2 is required to have high mobility and high voltage resistance characteristics. For example, in the electrophoretic display device which is an example of the display device DSP, a high voltage of greater than or equal to 70 V (greater than or equal±35 V) is applied between the source and the drain in the first transistor TR1 included in the shift register SR. Therefore, the first transistor TR1 is required to have high voltage resistance characteristics.

When the first transistor TR1 is configured to comprise polycrystalline silicon (p-Si) as a semiconductor, high voltage resistance characteristics greater than or equal to 70 V cannot be obtained. In addition, when the first transistor TR1 is configured to comprise amorphous silicon (a-Si) as a semiconductor, the required mobility cannot be achieved.

Therefore, an oxide semiconductor transistor is applied as the first transistor TR1 in the present embodiment. In addition, the first transistor TR1 has the first low-resistance areas LS1 and LD1 larger than the second low-resistance areas LS2 and LD2 of the second transistor TR2. Therefore, the first transistor TR1 can obtain higher voltage resistance characteristics than the second transistor TR2 with regard to possible high voltage applied between the source and the drain.

As an example, when a high voltage of greater than or equal to 70 V (greater than or equal to ±35 V) is applied between the source and the drain, the lengths of the first low-resistance areas LS1 and LD2 are preferably greater than or equal to 2 µm. However, the lower limits of the lengths required for the first low-resistance areas LS1 and LD1 vary according to the magnitude of the voltage applied between the source and the drain, and may be acceptable even when less than 2 µm.

In addition, in the present embodiment, the first transistor TR1 has a bottom-gate structure comprising the first gate electrode GE1 between the first oxide semiconductor SC1 and the insulating substrate 10. Furthermore, the first low-resistance areas LS1 and LD1 are located directly above the first gate electrode GE1. Furthermore, the insulating film 11 interposed between the first gate electrode GE1 and the first oxide semiconductor SC1 has a thickness of greater than or equal to 300 nm. Therefore, the first transistor TR1 can obtain high voltage resistance characteristics with regard to possible high voltage applied to the first gate electrode GE1.

According to the present embodiment, the gate drivers GD1 and GD2 can be composed using the first transistor TR1 comprising the first oxide semiconductor SC1. Accordingly, the area of the surrounding area SA can be reduced as compared with a configuration where IC chips are mounted as the gate drivers. Therefore, the size of the display device DSP can be reduced. In addition, the number of IC chips mounted can be reduced, and the cost can be reduced.

Since the size and price of the display device DSP can be reduced, the display device DSP described in the present embodiment can be applied to a personal terminal.

Next, the inventors performed a reliability test on the first transistor TR1. The conditions of a stress applied to the first transistor TR1 are as follows. The voltage applied to the first gate electrode GE1 was 40 V, the voltage applied between the first source electrode SE1 and the first drain electrode DE1 was ±38 V, and were applied for 1000 seconds in an environment of 60° C.

In the reliability test, Vg-Id characteristics in an initial state before the stress application and Vg-Id characteristics after the stress application were compared with each other. Vg is voltage (V) applied to the first gate electrode GE1, and Id is current (A) output from the first drain electrode DE1. The results of the reliability test are graphed showing the voltage Vg on the horizontal axis and the current Id on the vertical axis.

As the Vg-Id characteristics, those before and after the stress application of (A) when the voltage between the source and the drain was set to 0.1 V, (B) when the voltage between the source and the drain was set to 10 V, and (C) when the voltage between the source and the drain was set to 20 V are graphed.

Figure 5:
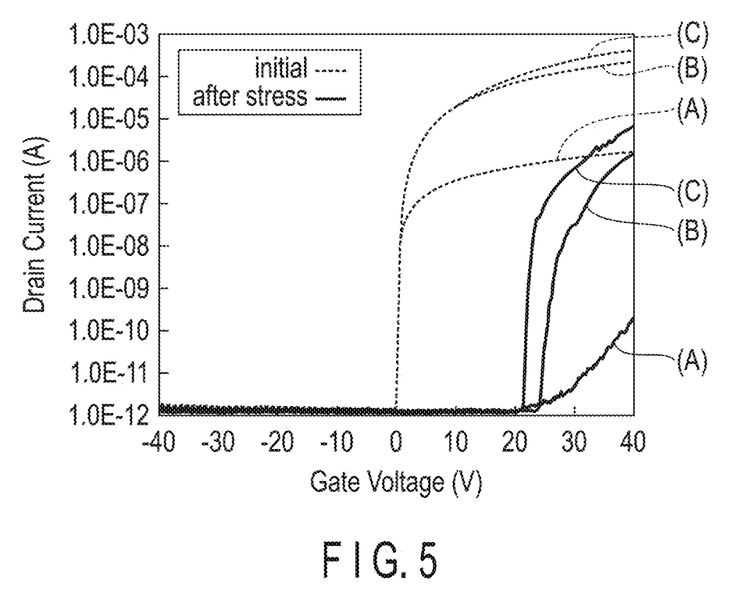
FIG. 5 is an illustration showing the results of the reliability test of the first transistor TR1 according to a comparative example.

FIG. 5 is an illustration showing the results of the reliability test of the first transistor TR1 according to a comparative example. In the first transistor TR1 according to the comparative example, the lengths of the low-resistance areas LS1 and LD1 are set to 1.5 µm.

When the Vg-Id characteristics before the stress application and the Vg-Id characteristics after the stress application are compared with each other, it is confirmed that a gate voltage (threshold voltage) where a drain current is output is significantly shifted.

Figure 6:
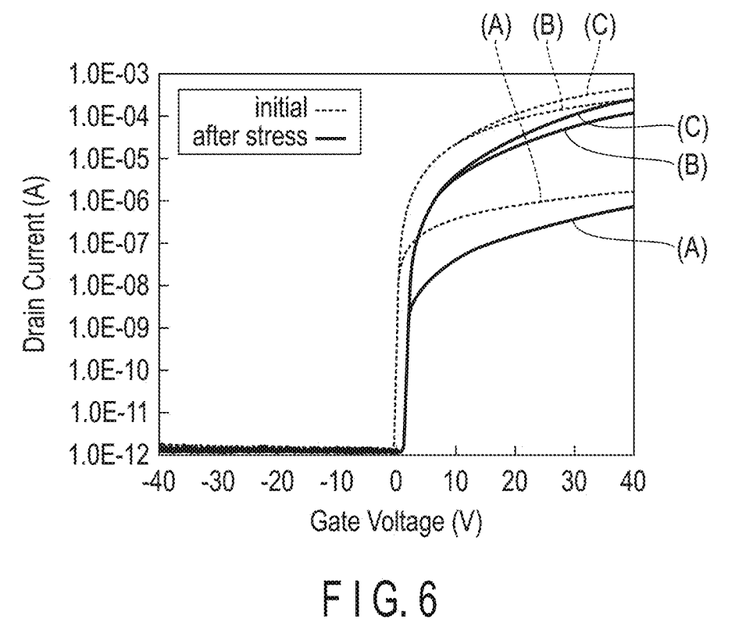
FIG. 6 is an illustration showing the results of the reliability test of the first transistor TR1 according to the present embodiment.

FIG. 6 is an illustration showing the results of the reliability test of the first transistor TR1 according to the present embodiment. In the first transistor TR1 according to the present embodiment, the lengths of the first low-resistance areas LS1 and LD1 are set to 2 µm.

When the Vg-Id characteristics before the stress application and the Vg-Id characteristics after the stress application are compared with each other, it is confirmed that a gate voltage (threshold voltage) where a drain current is output is hardly shifted. That is, according to the first transistor TR1 of the present embodiment, even after a high voltage of greater than or equal to 70 V was applied between the source and the drain for a long time or repeatedly, the threshold hardly fluctuates, and high reliability can be achieved.

As described above, according to the present embodiment, a display device which can be reduced in size can be provided.

The present invention is not limited to the embodiments described above but the constituent elements of the invention can be modified in various manners without departing from the spirit and scope of the invention. Various aspects of the invention can also be extracted from any appropriate combination of a plurality of constituent elements disclosed in the embodiments. Some constituent elements may be deleted in all of the constituent elements disclosed in the embodiments. The constituent elements described in different embodiments may be combined arbitrarily.

Although an electrophoretic display device requiring high drive voltage has been described in the present embodiment, the present invention can also be applied to a liquid crystal display requiring a higher applied voltage than a normal liquid crystal display, or a polymer dispersed liquid crystal or a high-speed drive display using it as a high-speed response liquid crystal display.

What is claimed is:

1. A display device comprising:
   an insulating substrate;
   a first gate electrode in a surrounding area above the insulating substrate, and included in a gate driver;
   a second gate electrode in a display area above the insulating substrate, and integrated with a gate line driven by the gate driver, the surrounding area associated with the first gate electrode being outside of the display area in an overhead plan view of the display device;
   a first insulating film covering the first gate electrode and the second gate electrode;
   a first oxide semiconductor above the first gate electrode, and in contact with the first insulating film;
   a second oxide semiconductor disposed above the second gate electrode, and in contact with the first insulating film;
   a second insulating film covering the first oxide semiconductor and the second oxide semiconductor;
   a first source electrode associated with the first gate electrode and in contact with the second insulating film, and in contact with the first oxide semiconductor in a first opening of the second insulating film;
   a first drain electrode associated with the first gate electrode and in contact with the second insulating film, and in contact with the first oxide semiconductor in a second opening of the second insulating film;
   a second source electrode associated with the second gate electrode and in contact with the second insulating film, and in contact with the second oxide semiconductor in a third opening of the second insulating film;
   a second drain electrode associated with the second gate electrode and in contact with the second insulating film, and in contact with the second oxide semiconductor in a fourth opening of the second insulating film;
   a first stack layer is comprised of the second insulating film and the first source electrode and is between the first opening and the second opening; and
   a second stack layer is comprised of the second insulating film and the second source electrode and is between the third opening and the fourth opening, wherein
   in a side sectional view, a first length of the first layer stack of the second insulating film and the first source electrode between the first opening and the second opening is greater than a second length of the second layer stack of the second insulating film and the second source electrode between the third opening and the fourth opening.

2. The display device of claim 1, further comprising:
   a third layer stack is comprised of the second insulating film and the first drain electrode and is between the first opening and the second opening; and
   a fourth layer stack is comprised of the second insulating film and the second drain electrode and is between the third opening and the fourth opening,
   wherein a third length of a third layer stack of the second insulating film and the first drain electrode between the first opening and the second opening and in the surrounding area is greater than a fourth length of a fourth layer stack of the second insulating film and the second drain electrode between the third opening and the fourth opening and in the display area.

3. The display device of claim 2, wherein the first length of the first layer stack of the second insulating film and the first source electrode and the third length of the third layer stack of the second insulating film and the first drain electrode are greater than or equal to 2 μm.

4. The display device of claim 2, wherein
   the first oxide semiconductor has a first channel area overlapping, in a thickness direction of the display device, a first space between the first source electrode and the first drain electrode, and first low-resistance areas overlapping the first layer stack of the second insulating film and the first source electrode and the third layer stack of the second insulating film and the first drain electrode, respectively, and having a lower resistance than the first channel area, and
   the second oxide semiconductor has a second channel area overlapping, in the thickness direction of the display device, a second space between the second source electrode and the second drain electrode, and second low-resistance areas overlapping the second layer stack of the second insulating film and the second source electrode and the fourth layer stack of the second insulating film and the second drain electrode, respectively, and having a lower resistance than the second channel area.

5. The display device of claim 2, wherein
   the first oxide semiconductor and the second oxide semiconductor are in a same plane,
   the first layer stack of the second insulating film and the first source electrode and the third layer stack of the second insulating film and the first drain electrode are directly above the first gate electrode, and
   the second layer stack of the second insulating film and the second source electrode and the fourth layer stack of the second insulating film and the second drain electrode are directly above the second gate electrode.

6. The display device of claim 1, further comprising a third insulating film in contact with the second insulating film between the first source electrode and the first drain electrode and in contact with the second insulating film between the second source electrode and the second drain electrode, wherein
   the third insulating film is formed of silicon oxide.

7. The display device of claim 1, wherein a thickness of the first insulating film between the first gate electrode and the first oxide semiconductor is greater than or equal to 300 nm.

8. The display device of claim 1, wherein
the first layer stack is in the surrounding area, and
the second layer stack is in the display area.

9. A display device comprising:
an insulating substrate;
a first gate electrode in a surrounding area above the insulating substrate, and included in a gate driver;
a second gate electrode in a display area above the insulating substrate, and integrated with a gate line driven by the gate driver, the surrounding area associated with the first gate electrode being outside of the display area in an overhead plan view of the display device;
a first insulating film covering the first gate electrode and the second gate electrode;
a first oxide semiconductor above the first gate electrode, and in contact with the first insulating film; and
a second oxide semiconductor above the second gate electrode, and in contact with the first insulating film, wherein the first oxide semiconductor has a first channel area, and first low-resistance areas adjacent to the first channel area and having a lower resistance than the first channel area, the second oxide semiconductor has a second channel area, and second low-resistance areas adjacent to the second channel area and having a lower resistance than the second channel area, and in a side sectional view, a first length of each of the first low-resistance areas is greater than a second length of each of the second low-resistance areas.

10. The display device of claim 9, wherein the first length of each of the first low-resistance areas is greater than or equal to 2 µm.

11. The display device of claim 9, wherein
the first oxide semiconductor and the second oxide semiconductor are in a same plane,
the first low-resistance areas are directly above the first gate electrode, and
the second low-resistance areas are directly above the second gate electrode.

12. The display device of claim 9, wherein a thickness of the first insulating film between the first gate electrode and the first oxide semiconductor is greater than or equal to 300 nm.

\* \* \* \* \*